United States Patent [19]
Lin et al.

[11] Patent Number: 5,581,742
[45] Date of Patent: Dec. 3, 1996

[54] APPARATUS AND METHOD FOR EMULATING A MICROELECTRONIC DEVICE BY INTERCONNECTING AND RUNNING TEST VECTORS ON PHYSICALLY IMPLEMENTED FUNCTIONAL MODULES

[75] Inventors: Chong M. Lin, Sunnyvale; Wai-Yan Ho, San Jose; Le Trong Nguyen, Monte Sereno, all of Calif.

[73] Assignee: Seiko Epson Corporation, Tokyo, Japan

[21] Appl. No.: 352,680

[22] Filed: Nov. 30, 1994

Related U.S. Application Data

[63] Continuation of Ser. No. 831,272, Feb. 7, 1992, abandoned.
[51] Int. Cl.⁶ .................................................. G06F 11/26
[52] U.S. Cl. ........................................ 395/500; 364/578
[58] Field of Search .......................... 395/500; 364/578, 364/488–490; 371/23, 15.1

[56] References Cited

U.S. PATENT DOCUMENTS

| | | | |
|---|---|---|---|
| 4,488,354 | 12/1984 | Chan et al. | 29/830 |
| 4,527,234 | 6/1985 | Bellay | 395/500 |
| 4,635,218 | 1/1987 | Widdoes, Jr. | 364/578 |
| 4,644,487 | 2/1987 | Smith | 364/578 |
| 4,811,201 | 3/1989 | Ran et al. | 395/311 |
| 4,868,770 | 9/1989 | Smith et al. | 364/578 |
| 4,872,126 | 10/1989 | Premerlani et al. | 364/578 |
| 4,937,827 | 6/1990 | Beck et al. | 371/23 |
| 5,006,981 | 4/1991 | Beltz et al. | 395/281 |
| 5,051,938 | 9/1991 | Hydrike | 364/578 |
| 5,084,824 | 1/1992 | Lam et al. | 364/490 |
| 5,224,055 | 6/1993 | Grundy et al. | 364/488 |
| 5,253,181 | 10/1993 | Marni et al. | 264/489 |
| 5,263,149 | 11/1993 | Winlow | 395/500 |

OTHER PUBLICATIONS

"VLSI Risc Architecture and Organization" by Furber published by Marcel Dekker, Inc., pp. 23–24, 1989.
Gosch, "Function Blocks Speed Up Chip Development", *Electronic Design*, May 1, 1992 (pp. 101–108).
Liu et al., "A CMOS Cell Library Design for Testability", VLSI Systems Design, vol. 8, No. 5, pp. 58–60, 64 and 65, May 1987.
Stephen B. Furber, "VLSI RISC Architecture and Organization", Marcel Dekker, Inc., pp. 23–24, 1989.
Lisa Maliniak, "System Simulation Still Holds Promise", *Electronic Design*, Feb. 6, 1992, pp. 53–61.

*Primary Examiner*—William M. Treat
*Assistant Examiner*—Viet Vu
*Attorney, Agent, or Firm*—Sterne, Kessler, Goldstein & Fox P.L.L.C.

[57] ABSTRACT

A simulation system for a microelectronic device having two or more functional modules from a megacell library, the simulation system utilizing actual physically implemented versions of each functional module (or block) from the megacell library so as to provide a more accurate and much faster simulation than a comparable software- or field programmable gate array-based simulation. The simulation system comprises means for providing a physically-based implementation of each functional module of a proposed design for a microelectronic device, the physically-based implementation being disposed on one or more test microelectronic devices used by the simulation system. Interconnecting means is used for electrically coupling together each of the physically-based implemented functional modules so as to produce the proposed design of the proposed microelectronic device. Emulation is performed by applying one or more test vectors at a preselected clock speed of the proposed design using the physically-based functional modules electrically coupled together to produce the proposed design, wherein the test vectors can be completed much faster as compared to a comparable software- or field programmable gate array-based simulation and wherein the results of the test vectors are much more accurate that the comparable simulations because the physically-based functional modules are used at a comparably lower cost.

18 Claims, 9 Drawing Sheets

APPARATUS AND METHOD FOR EMULATING A MICROELECTRONIC DEVICE BY INTERCONNECTING AND RUNNING TEST VECTORS ON PHYSICALLY IMPLEMENTED FUNCTIONAL MODULES

This appllication is a continuation of application Ser. No. 07/831,272, filed Feb. 7, 1992.

BACKGROUND OF THE INVENTION

1. Field of the Invention

The present invention relates to chip testing systems and methods, and more particularly, the present invention relates to a hardware emulation accelerator system and method for testing microelectronic device designs.

2. Related Art

There are many considerations which must be born in mind when designing a computer architecture for Very Large Scale Integrated (VLSI) chips. Several major considerations are discussed by Stephen B. Furber, in his text titled, *VLSI RISC Architecture and Organization*, (Marcel Dekker, Inc., 1989).

The cost of processing a particular size of wafer is roughly constant, but defects cause die costs to increase more rapidly than linearly with area. Chips above a certain area are effectively unmanufacturable. Therefore the functionality which is to go on a single chip must be specified very carefully to ensure that the economics of the product are appropriate. The designer must also be aware of the strongly two-dimensional nature of VLSI design, which makes the topology of the functions and connections between them extremely important. Topologically efficient layouts (such as most memory devices) can contain an order of magnitude more transistors per unit area than interconnect dominated random logic structures. Estimating the eventual size of a layout from a logic diagram is hard.

An important aspect of VLSI is that the effort required to produce a design does not depend on the total number of transistors used so much as the number of different elementary (leaf or standard) cells required. Once a single register bit has been designed, it is relatively easy to replicate it to produce a register bank of arbitrary size. It is certainly quicker than generating a random logic function which uses far fewer transistors.

Therefore VLSI designers strive to build regular structures, which are based on tessellated arrays of standard cells. Currently, there are four groupings of regular structure approaches to ASIC design: sea-of-gates, gate arrays, standard cells and megacells (megacells being the most organized).

The intermediate approach to random logic is to use a cell library, where a set of standard gates, latches, flip-flops, etc. is designed and characterized, and the circuit designer picks up appropriate cells and wires them together. This approach does not yield the smallest possible layout, but the turn around time can be fast. It may also be a good way to implement a small amount of logic, which for one reason or another cannot be incorporated into a regular structure.

This design methodology can also be applied to Ultra Large Scale Integration (ULSI) chips as well. The difference being that in ULSI, the regular structures are larger and have more functionality. In ULSI the regular structures having unique functional features are called megacells.

It is hard to determine what is wrong with a VLSI device, not to mention a larger ULSI device, if it does not work, and trying to fix the problem once it is identified can take several months or more. There is therefore a great incentive to produce working devices based on an initial design. When the device has the complexity of a superscalar RISC processor, for example, this is not easy.

Once the design is correct, it is tempting to assume that mass production is straightforward. This assumption is false! When a large integrated circuit is manufactured in volume, at least half of the manufactured devices will not work. The defects which cause failure are varied and random, and all devices must be thoroughly tested to identify the rejects. The test program should exercise all the transistors on the chip to ensure they are functioning, and make sure that any failure will affect the measured outputs at the pins. Speed of critical paths must be measured to make sure that the transistors are up to the required performance, and so on.

1. Conventional Software Emulation

Several software simulation applications are commercially available for the testing of microelectronic devices such as microprocessors, and the like. Emulation on a behavior level and circuit analysis at the transistor level are two extreme possibilities. (A logic level simulator, such as SILOS, and a switching level simulator, such as Timemill, are intermediate simulation tools.)

A behavior level software simulation tool called Verilog, which is manufactured by Cadence Design Systems, Inc., San Jose, Calif., is conventionally used by many design houses to verify high level design concepts. Because the software simulation only takes into consideration behavioral operation, timing, layout and physics of the microelectronic device design are not accurately evaluated. For VLSI and ULSI microelectronic devices, this type of simulation is fine from an initial architecture point of view, but is a far cry from predicting whether the microelectronic device itself will work due to modeling limitation on circuit timing and loading. For instance, a bilateral circuit that propagates data to both directions, can have too strong a feedback circuit which may change the input if the transistor has a feedback loop exposed to the output node (when coupled with time, the result cannot be easily determined by Verilog).

Software applications which operate on the circuit analysis level provide more accurate device emulation, but can take up to a few days to process one test vector on a microelectronic device including only 100 thousand transistors. Thus the processing of a meaningful number of test vectors is virtually impossible using for such circuit analysis software tools. An example of such a software simulator is SAGE, which is manufactured by Meta-Software, Inc., Campbell, Calif. A SAGE-type simulator is faster than a SPICE simulator, but even SAGE simulation is based on device models and approximated device equations, not to mention simulation resolution limitations, such as temperature and 3-D effects on devices and interconnections.

2. Conventional Field Programmable Gate Array Emulation

Quickturn Systems, Inc., of Mountain View, Calif., manufactures a 1 Mhz hardware emulator using field programmable gate arrays (FPGA), which is a about $10^6$ improvement over the software testing techniques discussed in the preceding section. Using this approach involves the programming of field programmable gate arrays, such as fused link PALs, EPROMs, EEPROMs, and the like, to logically construct building blocks to functionally match the proposed design for the microelectronic device to be tested. However, each logic design change for the microelectronic device being tested requires reprogramming and partitioning of the field programmable gate array. This hardware replacement or reprogramming is done at moderate cost and can be labor intensive, and takes time to verify the function.

Both conventional testing techniques, software and hardware, have a modeling accuracy problem, since the transistors and critical timing paths, as well as loading and coupling, not to mention more subtle device leakage and charge redistribution effects, are not actually tested.

Software applications, such as Verilog operating on a behavior model level take seconds or tenths of seconds to perform one test vector on a ULSI chip. But testing on the behavior model level does not provide the necessary modeling of each transistor and critical path as emphasized above.

The design and development of the test program absorbs as much effort as the logic design of the device itself, and can be greatly eased by careful consideration of test issues during the logic design phase. Considerable quantities of logic may be added just to simplify testing. Testing costs can be a significant proportion of the total device costs. Designing for testability is vital.

To translate a design into device/circuit models, Quickturn or other vendors would need to go through certain translation tables, and the result can put 5 to 10 times more devices on the FPGA type chip than the real circuit. The overhead can be tremendous. Imagine the size of a 4M transistor ULSI chip emulator at 40M transistors! Moreover, the amount of time required to burn-in or program that size FPGA emulator is considerable. It may take a team of engineers more than a year to generate the design translation to a testable stage.

These considerations affect architectural decisions in complex ways, and furthermore they are tied to semiconductor technology which is advancing rapidly. The constraints represent moving targets; a VLSI or ULSI architecture which is in some sense optimal at one point in time will cease to be so a few years later, and would have been unmanufacturable a few years earlier.

It is necessary, therefore, when designing an architecture for VLSI or ULSI, to estimate the time to complete the design and to implement it, and to match the design to the semiconductor technology which might reasonably be expected to be available at that future time.

SUMMARY OF THE INVENTION

The present invention is directed to a hardware emulation accelerator with physical components that supports a super-ASIC megacell library.

The general hardware emulation accelerator chip in accordance with the present invention (henceforth called the hardware accelerator) has a testability and interconnect-enhanced design. The hardware accelerator comprises physically implemented functional modules connected to parallel I/O bus lines. Each physically implemented functional module may comprise one or more blocks. Because of the testability enhanced design, defective chips can be easily tested and identified, so that unflawed physically implemented functional modules and/or blocks within the defective chips can be used as hardware accelerator components. Parallel access/random scan testability of any module or any block within a module is accomplished via the parallel I/O bus lines which are available for testing and use during emulation. In addition, a novel "selective power down" scheme is implemented for further power saving and prolonging of chip life time.

A super-ASIC (Application Specific Integrated Circuit) megacell library comprises a collection of pretested, physically implemented functional modules and/or blocks. These modules and blocks may be selected from the library and interconnected to create a hardware accelerator to meet a microelectronic device design. The hardware accelerator can then be tested to verify whether the design will perform to the customer's satisfaction. Once the design is verified, the chip can be manufactured because it will comprise equivalent library modules as those used for the hardware accelerator.

Physically implemented functional modules are tested and later used for emulation. Therefore, there is effectively minimum performance difference between the hardware accelerator and the microelectronic device once it is manufactured.

Emulation of the microelectronic device using the hardware accelerator is performed at clock speeds that are limited by the interconnections of the pretested chips. Since many (e.g., 5–10) pretested chips are potentially required for creating a hardware accelerator to meet a given microprocessor design, the clock speed of the hardware accelerator is limited. However, even testing at reduced clocks speeds (e.g., on the order of 10 MHz), the hardware accelerator can process well over ten times the number of test vectors than conventional hardware emulation applications. Furthermore, the modeling accuracy of the hardware accelerator technique of the present invention is far superior than conventional emulation applications, because the hardware accelerator comprises the physically implemented functional modules that will be used in the final microelectronic device. When combined with selectively turning off the power to unused modules actual power dissipation can be measured to approach that of real operation.

Reducing the amount of time to process test vectors will permit customers to bring new designs to market faster. Although lower to-market latency usually translates to uncertain performance, the superior modeling accuracy of the present invention will alleviate this problem. Based on this scheme, the cost for manufacturing and testing according to the present invention is low because the chip yield of the hardware acceleration's physically implemented functional modules is very high.

Triggering problems due to mismatches in transistor gate width ratios can also be tested by the present invention. Switching speed can also be tested. Switching at too fast a rate can cause ground bounce and race conditions, and slow switching causes unwanted delays.

In addition, functional modules or blocks selected from chips having different process corner can be used to test worst case corner at chip level and at board level. This testability provides pre-tested and characterized data by which chips can be selected for meeting proposed design criteria and testing "worst case" scenarios. These problems cannot be checked by translation table hardware approach, nor can they be accurately simulated by software.

The foregoing and other features and advantages of the present invention will be apparent from the following more particular description of the preferred embodiments of the invention, as illustrated in the accompanying drawings.

BRIEF DESCRIPTION OF THE DRAWINGS

The invention will be better understood if reference is made to the accompanying drawings.

DETAILED DESCRIPTION

Figure 1A:
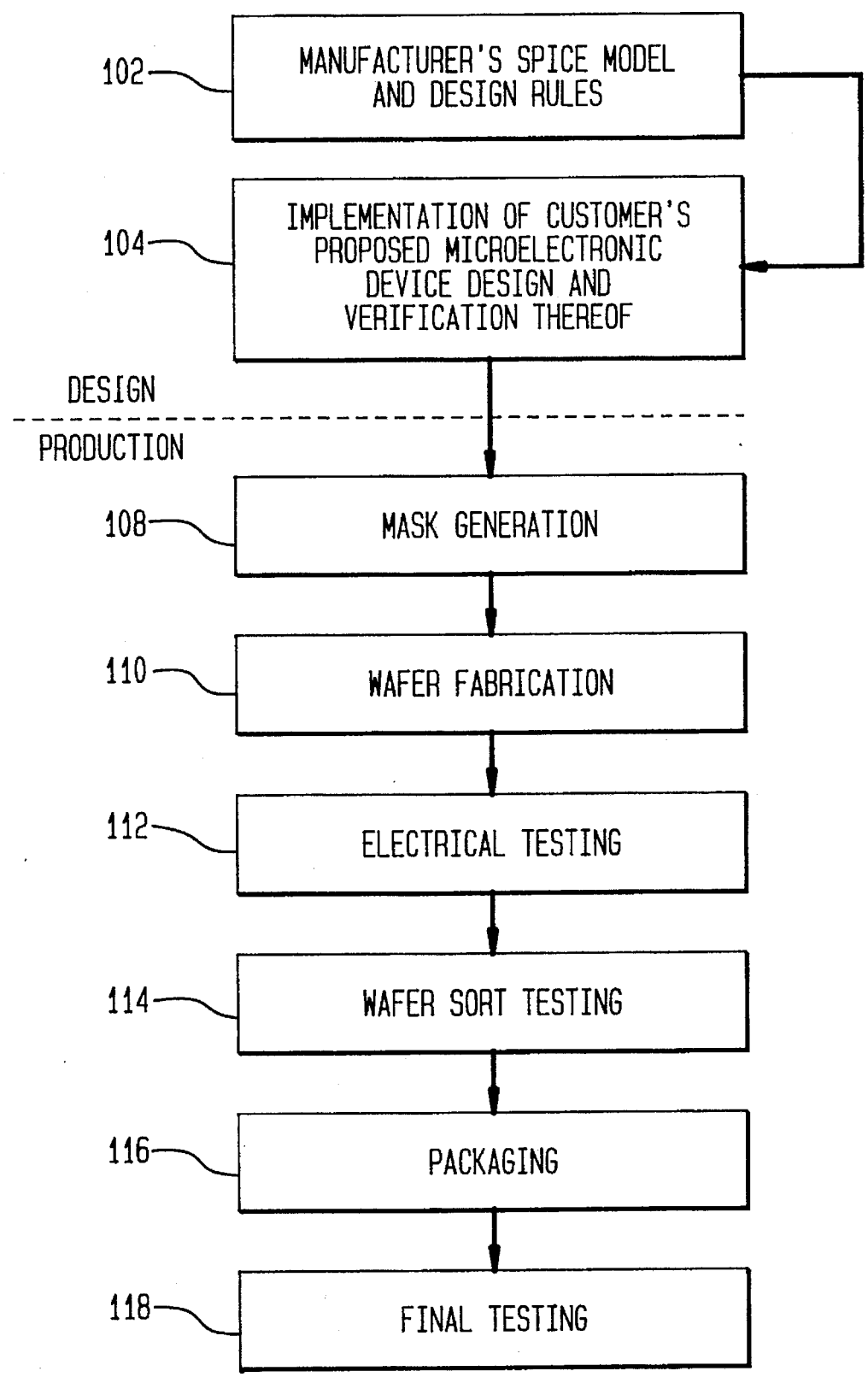
FIGS. 1A and B are representative flow charts of a design/fabrication/testing process for a microelectronic device.

FIG. 1A is a flow chart showing a representation of the design fabrication and testing process of microelectronic devices. A block or step 102 represents a manufacturer's development tools including SPICE models, layout design rules, and the like, which are used to implement a proposed microelectronic design. The knowledge base represented by block 102 is then applied to a customer's proposed microelectronic device design, as shown at a block 104. The proposed microelectronic device design may include, for example, the architectural definition and simulation, logic design and simulation, circuit design and simulation, and layout of the proposed microelectronic device.

Figure 1B:
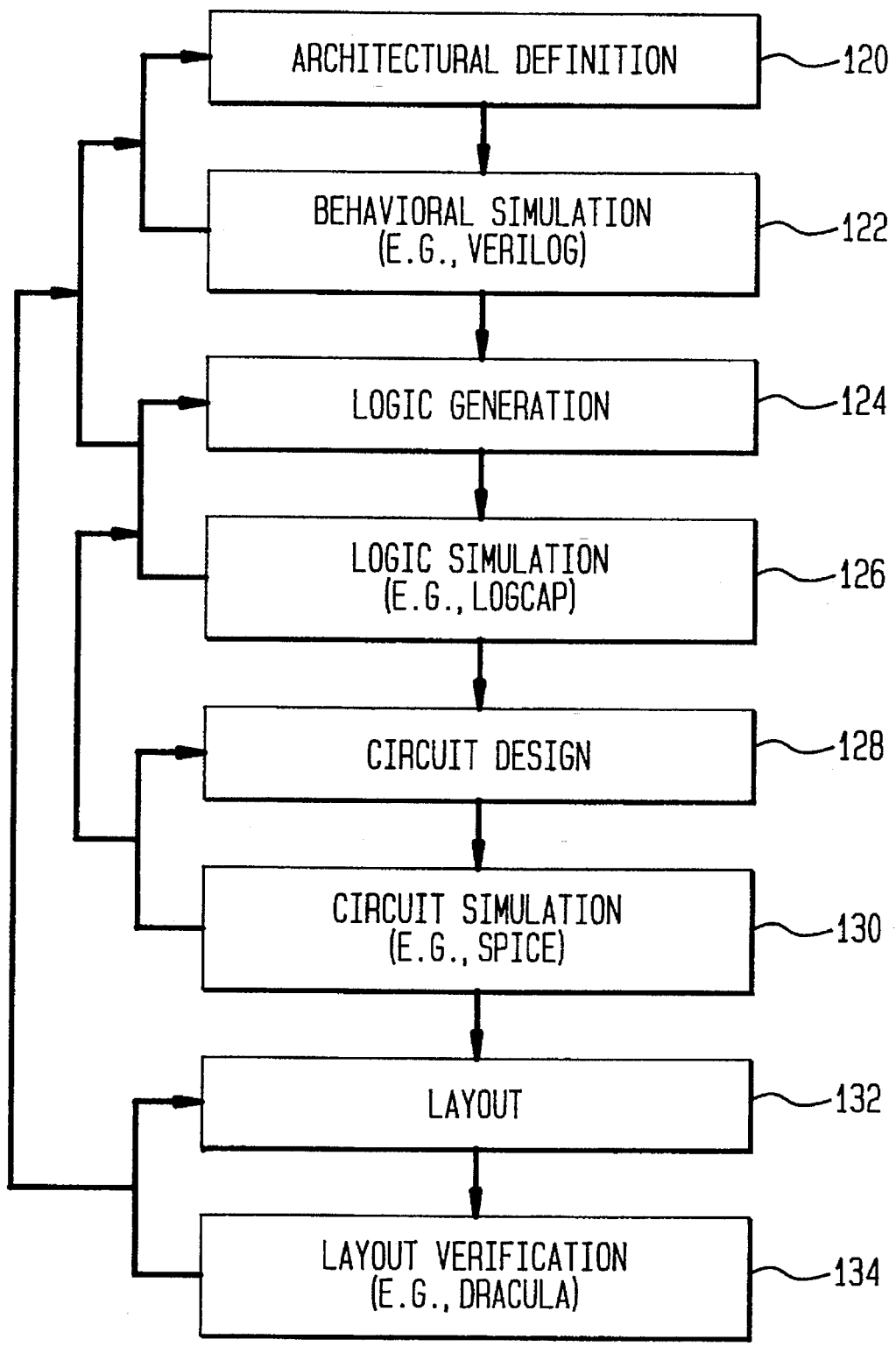

An integrated design/simulation process is shown at FIG. 1B. Once a proposed microelectronic device has been designed, it is then tested using behavioral and logic simulators, laid out, and then verified against design rules, schematics and extract loading information. The design/simulation process at blocks 120–134 are performed by various software simulation tools and techniques. Various levels of simulation, such as behavioral, logic, timing, and circuit are commercially available. An example of this verification process is discussed in *Principles Of CMOS VLSI Design, A Systems Perspective*, by Weste et al., (Addison-Wesley Publishing Company, Reading, Mass., (1985) pp. 255–269).

Once a post layout verification is completed, a mask generation step is performed at the beginning of the "production" process, as shown at a block 108. Next, the microelectronic device is fabricated, as shown at a wafer fabrication step in a block 110.

The final three steps in the representative process of FIG. 1 include wafer sort testing, packaging and final testing, which are shown at blocks 414, 416, and 418, respectively.

The following describes the creation and operation of a super-ASIC (Application Specific Integrated Circuit) megacell library of the present invention.

The methodology employed by the present invention uses microelectronic devices to the greatest degree possible in the form of physically implemented functional modules for design and fabrication of microelectronic devices, rather than hand crafting entire microelectronic devices. A super-ASIC megacell library is created in which various physically implemented functional modules are organized. The physically implemented functional modules may comprise floating point units, arithmetic logic units, cache controller units, memory translation units, input/output (I/O) controllers, ROMs, RAMs or other memory units, and hardware implemented neural-net modules, or the like. Such highly functional modules are more easily implemented using the super ASIC megacell library approach of the present invention, as compared to a standard cell or gate array implementation which would require the interconnection of many smaller blocks to achieve the same functionality at a slower speed and higher power dissipation.

A hardware emulation accelerator assembled using physically implemented functional modules from the super-ASIC megacell library of the present invention is used in a novel verification process. This novel verification process can be used in conjunction with conventional verification processes to achieve, in a comparatively short time, a higher confidence level in the design than is otherwise possible.

Figure 2:
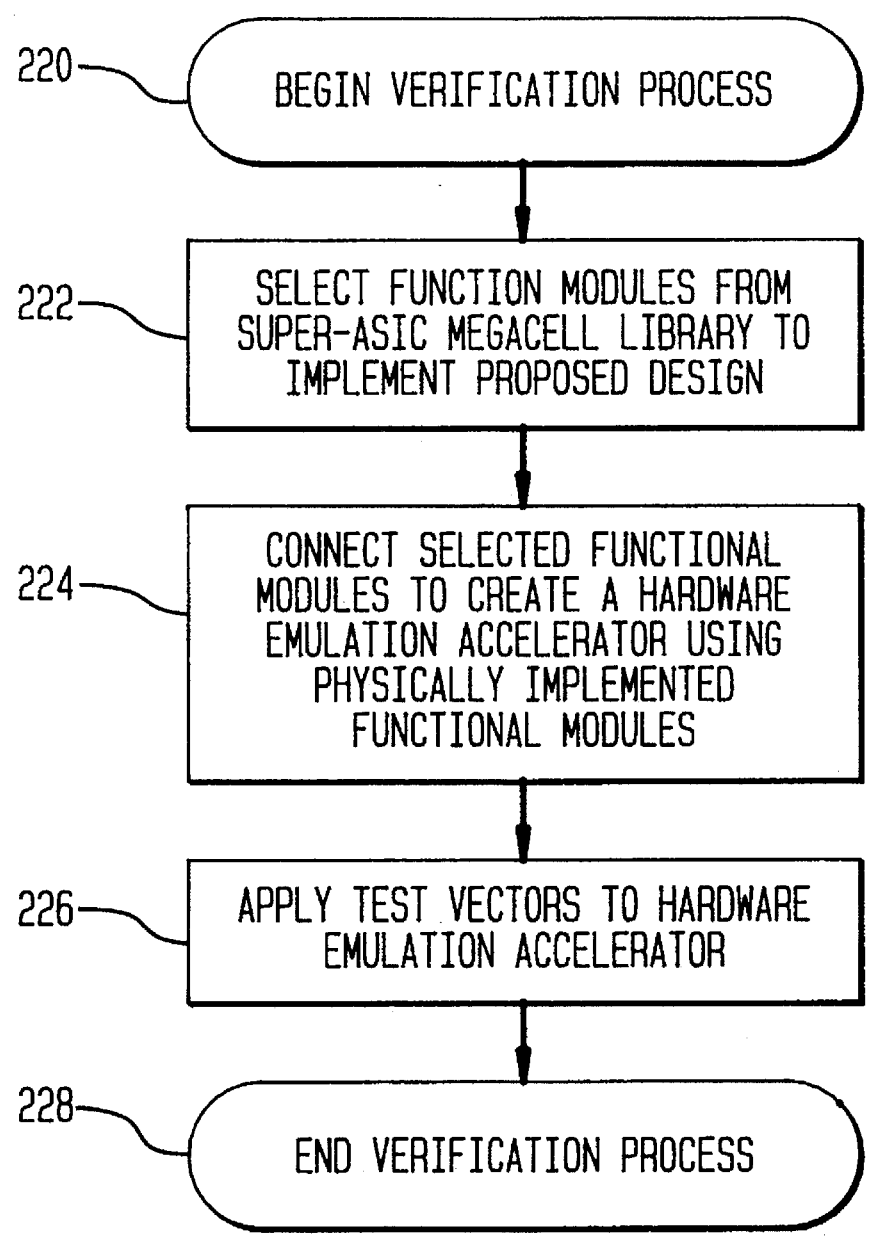
FIG. 2 is a high level flow chart showing the operational steps in the novel verification process of the present invention.

A representative flow chart of a verification process according to the present invention is shown in FIG. 2. The verification process begins at a block 220. The first step of the verification process, which is shown at a block 222, includes selection of physically implemented functional modules from the super-ASIC megacell library to implement the proposed microelectronic device design. The appropriate physically implemented functional modules are selected to meet a microelectronic device design (also called the design specification).

Next, the selected, physically implemented functional modules and/or blocks are "connected" to create a hardware emulation accelerator for emulating the microelectronic device, as shown at a block 224. The connection may be a combination of hardware and software connection or coupling, which is application specific. Test vectors are then applied to the hardware emulation accelerator, as shown at a block 226. The end of the verification process is shown at a step or block 228.

The phrase "physically implemented functional modules" indicates that the hardware emulation accelerator comprises functional modules that are physically equivalent to the functional modules that will eventually comprise the manufactured microelectronic device itself. The physically implemented functional modules are not merely functionally equivalent physical modules, but are identical to the microelectronic device on a layout and device level.

The present invention contemplates that only very small sections of the hardware emulation accelerator may be required to be specially designed for control purposes, in accordance with conventional practices to meet a proposed microelectronic device design. It thus can be appreciated that the modules which make up the major components of the hardware emulation accelerator are simply selected as off the shelf physically implemented functional units from the megacell library. The actual operation of the microelectronic device will therefore be emulated by the hardware emulation accelerator of the present invention.

The operation of the microelectronic device is determined by the design and the physics of the design, the physics being defined by the actual layout and how the layout is accomplished. The present invention is a very accurate emulator, because the actual layout and how the layout is accomplished (the actual devices) is the same for the physically implemented functional modules as it is for the fabricated functional modules of the final microelectronic device.

Figure 3:
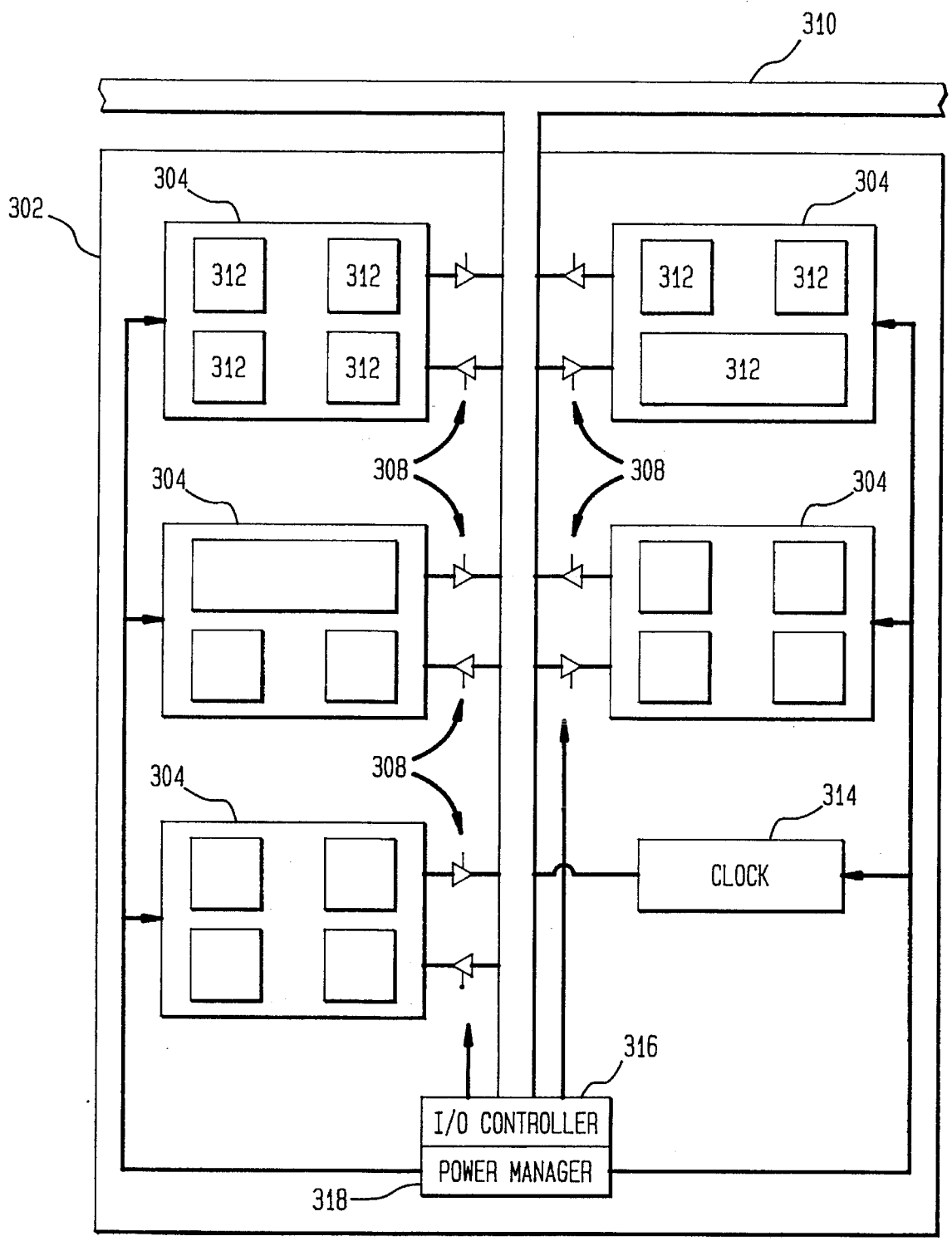
FIG. 3 is a high level block diagram of a floor plan showing representative functional modules of a microelectronic device in accordance with the present invention.

FIG. 3 is an example of the present invention which shows a representative semiconductor chip 302 and the connection of functional modules to produce a hardware emulation accelerator.

Chip 302 comprises a plurality of physically implemented functional modules 304 and an internal, input/out (I/O) bus 306. Physically implemented functional modules 304 are coupled to bus 306 using a plurality of tri-state buffers 308. Tri-state buffers 308 can be enabled/disabled to permit the proper flow of data between functional modules 304 and bus 306, as will become evident to those skilled in the art. Other buffering schemes and I/O buses may also be employed. Internal bus 306 is shown connected to an external parallel bus 310. This connection is conceptual and typically handled by I/O pads and the like. External power connections are not shown.

Functional modules 304 of the present invention may comprise one or more smaller functional blocks 312. For the purposes of this disclosure, the term "functional module" or "physically implemented functional module" will equally apply to the larger functional modules 304 themselves, or to blocks 312 within the functional modules 304. The specific operation of functional modules 304 and blocks 312 is not critical to the present invention. The present invention contemplates emulation of present and future computer architectures and microelectronic devices, including ASICs, to be implemented with physically implemented functional modules 304, or blocks 312 selected from any module on a single semiconductor chip or substrate. The hardware emulation accelerators themselves may comprise one or more chips.

The layout of chips 302 according to the present invention is based on a common bus 306 which facilitates parallel access and random scan to each functional module 304. Blocks 312 are also individually accessible via bus 306. The phrase "individually accessible" means that different functional modules 304 and blocks 312 can be addressed independently and hierarchically, so that data and control signals can be input and output to/from chip 302, and then decoded by control block 318. Random scanning facilitates the testing of any block of any module on chip 302. Parallel access via bus 306 permits all of the I/O bus lines to be available for testing or use, and each module can interact with other modules or blocks via bus 306 under control of block 318 or an external controller (not shown) connected to bus 310.

A system clock generator 314 is also shown as a functional module on chip 302. Each chip 302 may or may not include its own clock generator 314, depending on its application. Clock generator 314 may independently synchronize functional modules 304 and blocks 312 on its own chip, modules and blocks on other chips with programmable non-overlapping clock phase capability, or it may be a slave to a master clock coupled to bus 310. Clock generator 314 can control functional modules/blocks via bus 306/310 or via dedicated clock control lines (not shown).

In a preferred embodiment, an I/O control block 316 is included for generating select signals for tri-state buffers 308. A power management control block 318 may also be included for selectively turning on/off clock signals to functional modules 304 to conserve chip power. Alternatively, power management control block 318 may disable or enable tri-state buffers 308 to achieve the same result of saving power. Power management control block 318 can also perform selective power down of unused functional modules or blocks in order to more accurately model true power dissipation of the microelectronic device being emulated.

The super-ASIC megacell library approach supports high level, highly integrated, physically implemented functional modules of separate chips 302 to be connected together via bus 306/310. These physically implemented functional modules are very fast, densely integrated and use less power than a gate array or standard cell approach. Tri-state buffer logic 308 is fabricated on chip 302 so that each functional module can be selectively coupled/decoupled to/from bus 306. This permits the electrical connection (coupling) of functional modules on a single chip or connection of the I/O bus 310 to two or more chips so that functional modules on different chips can be connected together to emulate a microelectronic device through a time and/or space multiplexing arrangement.

The construction of a hardware emulation accelerator using physically implemented functional modules permits testing of a microelectronic proposed design before prototypes are actually manufactured. In addition, the hardware emulation accelerator may be used to test proposed design changes at virtually any stage of the manufacturing process. The present invention thus supports a testing methodology for a microelectronic device based on interconnected, pre-tested, and pre-characterized functional modules with process temperature and voltage corner conditions applied. Such advantages are not attainable with conventional emulation/simulation techniques.

Virtually any chips comprising physically implemented functional modules having the layout discussed in connection with FIG. 3 may be used for a hardware emulation accelerator of the present invention. The chips used to implement the present invention can be chips that are specially manufactured to comprise any number of megacell library modules or any other chips designed according to the bus layout methodology of FIG. 3. Since semiconductor chips manufactured according to the methodology of FIG. 3 lend themselves to parallel access random scanning and testing, even flawed chips, with only one working physically implemented functional module, for example, can be used in a hardware emulation accelerator. NMOS, PMOS, CMOS, BiCMOS, GaAs, photonic devices, and combinations thereof, are a few examples of conventional device/processing techniques that could be employed in connection with hardware emulation accelerator chips of the present invention at very low cost.

Figure 4:
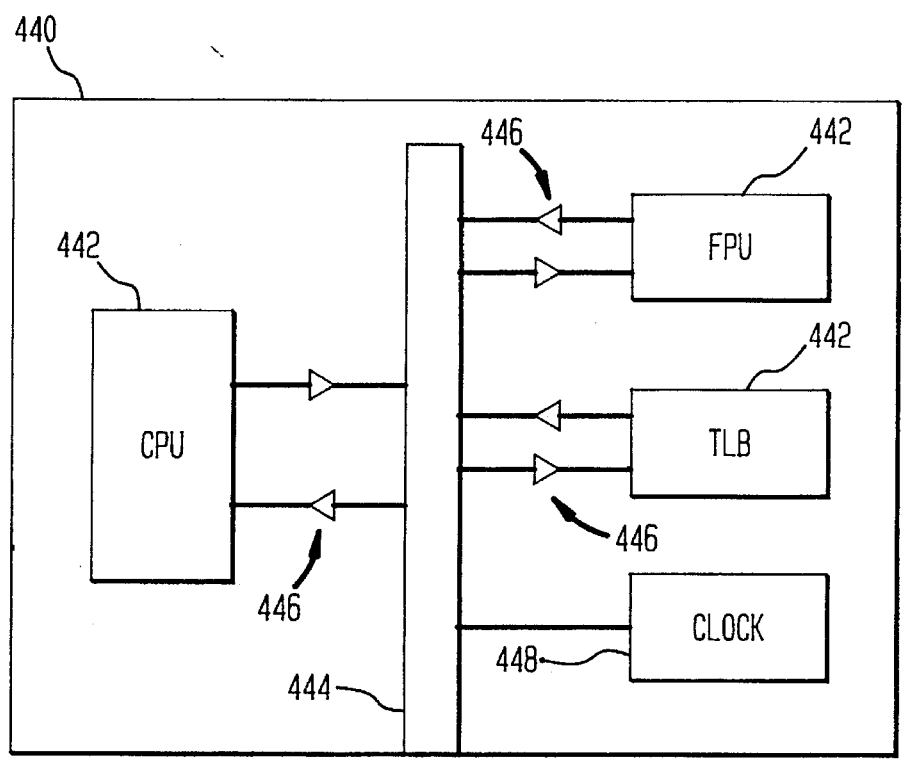
FIG. 4 is a high level block diagram a floor plan showing a representative microelectronic device in accordance with the present invention.
Figure 5:
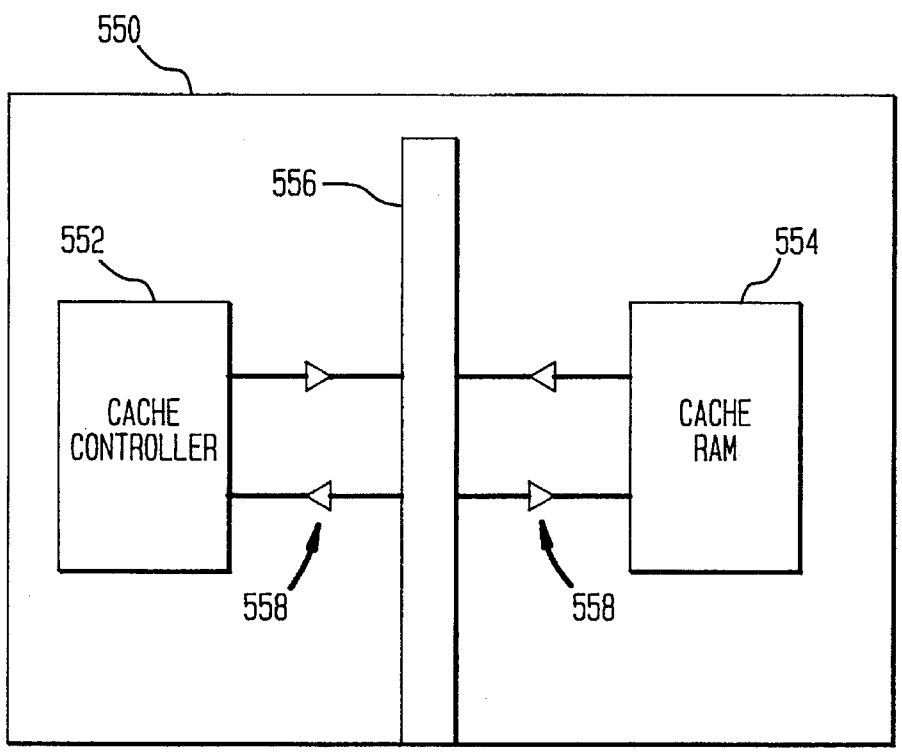
FIG. 5 is a further high level block diagram a floor plan showing a representative microelectronic device in accordance with the present invention.

Consider two example chips manufactured according to the methodology of FIG. 3. An N-bit microprocessor 440 shown in FIG. 4 and a cache memory unit 550 shown in FIG. 5, each comprise functional modules 442 and 552–554 coupled to a bus 444, 556 via tri-state buffers 446, 558 laid-out according to the methodology discussed above.

Functional modules 442 of N-bit microprocessor 440 may comprise, for example, a central processing unit (CPU), a floating point unit (FPU), a translation lookaside buffer (TLB) and a clock generator 448. Cache memory unit 550 may comprise, for example, a cache controller 552 and a cache RAM 554.

After fabrication of chips 440 and 550, the individual functional modules can be individually tested via buses 444 and 556. Those chips that are fully operational are used for their intended purposes. Conventionally, the remaining chips (i.e., those with defects), which are not fully operational, or not operational at all, are discarded.

In conjunction with the present invention, however, a large percentage of the defective chips which could be the result of one defect on the whole chip (1 defect/1 cm$^2$), are used to supply the megacell library because they have one or more operational functional modules. The partially operational chips that become part of the megacell library are eventually selected to implement a hardware emulation accelerator. The partially operational chips used to supply the megacell library may have as few as one working functional modules/blocks or many working functional modules/blocks. Only in extreme fault cases, such as at clock, I/O, $V_{DD}$ or $V_{SS}$ metal line short, will a chip not be used at all. The overall chip yield becomes very high compared to conventional chip yields. The cost becomes very low compared with conventional approaches, such as FPGA which are burned-in for only one application.

It thus can be appreciated that a chip 440, for example, having less than four working functional modules cannot be used as the N-bit microelectronic chip. However, rather than discarding the chip, its working functional modules are identified and labelled accordingly. The chip then becomes part of the super-ASIC megacell library of the present invention. The library therefore comprises pretested chips having functional modules which can be interconnected at a later time to create a hardware emulation accelerator of the present invention.

The labeling and categorizing of chips in the library is not critical to the present invention, as long as necessary chips with the desired functional modules/blocks can be selected, located and interconnected with zero or more other chips for fabricating a hardware accelerator. These labeling, categorizing, selecting, locating and fabrication steps are only illustrative of how the megacell library could be implemented. The present invention contemplates both manual and automated systems for performing these illustrative tasks.

A representative example of an automated hardware accelerator system 600 of the present invention is now described with reference to FIG. 6. In a preferred embodiment, automated hardware accelerator system 600 comprises a workstation 602, a megacell library 604, a design development tool database 606 and an automated hardware accelerator assembler 608.

A user 610 inputs instructions into automated hardware accelerator system 600 using workstation 602. Using workstation 602 and design development tool database 606, user 610 can create and refine a hardware emulation accelerator to test a microelectronic design. Based on the microelectronic design, user 610 can select functional modules from megacell library 604 via a bus 612 to meet the requirements of the microelectronic design. Workstation 602 can be programmed in a known manner to instruct the selected functional units in megacell library 604 to be sent to automated hardware accelerator assembler 608 via a bus 614 for assembly of a hardware emulation accelerator 616. Once hardware emulation accelerator 616 is completed, user 610 can apply test vectors to it using workstation 602. The test vectors can be applied to hardware emulation accelerator 616 via a bus 618. The emulation can be monitored via a bus 620 between hardware emulation accelerator 616 and workstation 602. Conventional testing can also be performed on the hardware emulation accelerator.

Workstation 602 may comprise a Sun workstation, IBM PS/2 or IBM compatible computer, a mainframe computer, or the like. Megacell library 604 may be in the form of a robotically operated storage mechanism or similar automatic warehouse for storing and manipulating pretested chips having functional modules. Similarly, automated hardware accelerator assembler 608 may be in the form of a robotically operated assembly mechanism which receives selected chips from megacell library 604 and assembles them into hardware emulation accelerator 616. Those skilled in the art will readily envision many automated systems and CAD/CAM software applications suitable or modifiable for performing the functionality of automated hardware accelerator system 600 that would not require undue experimentation to implement the present invention.

Figure 6:
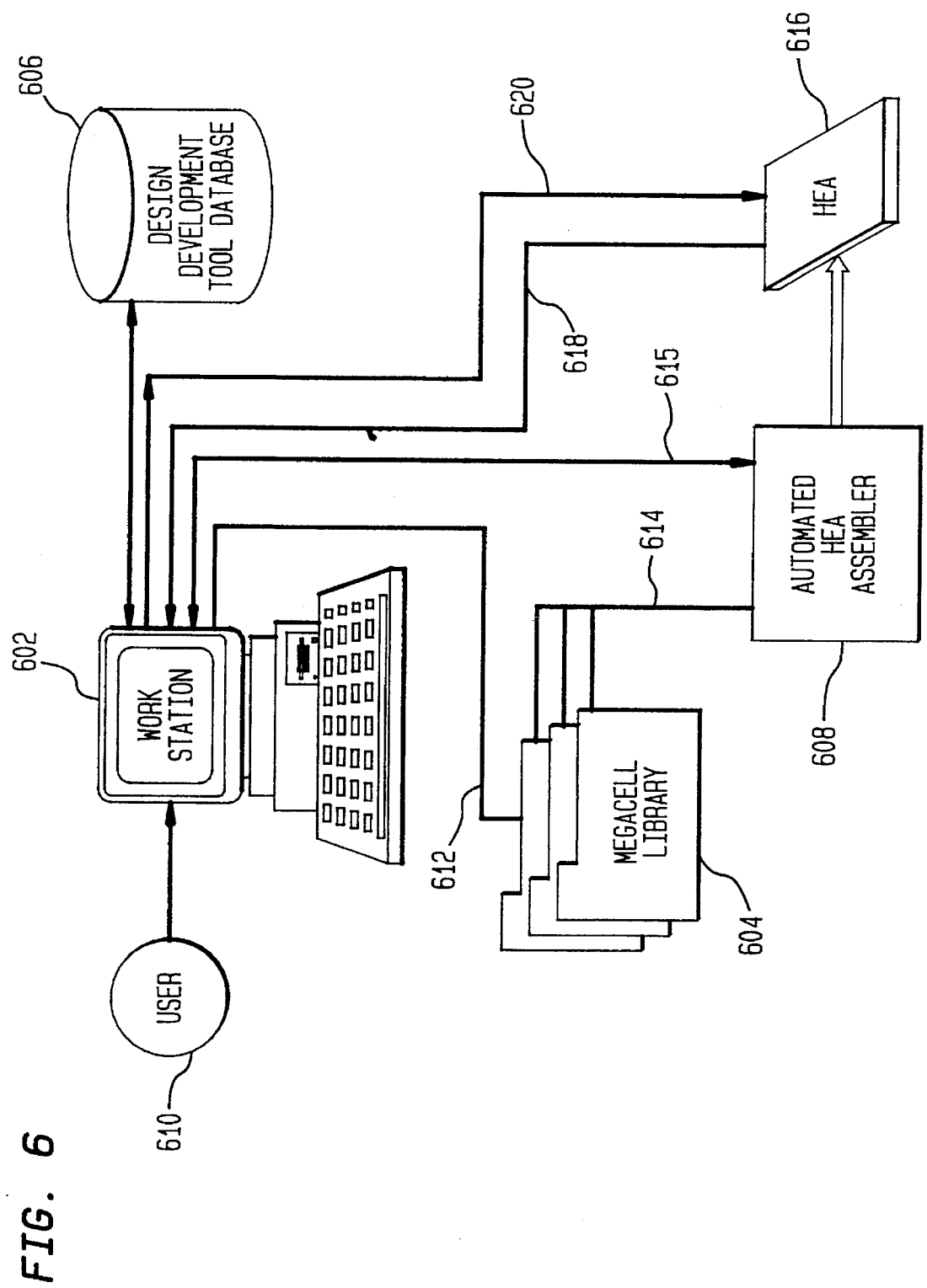
FIG. 6 is a representative example of an automated hardware accelerator system of the present invention.
Figure 7:
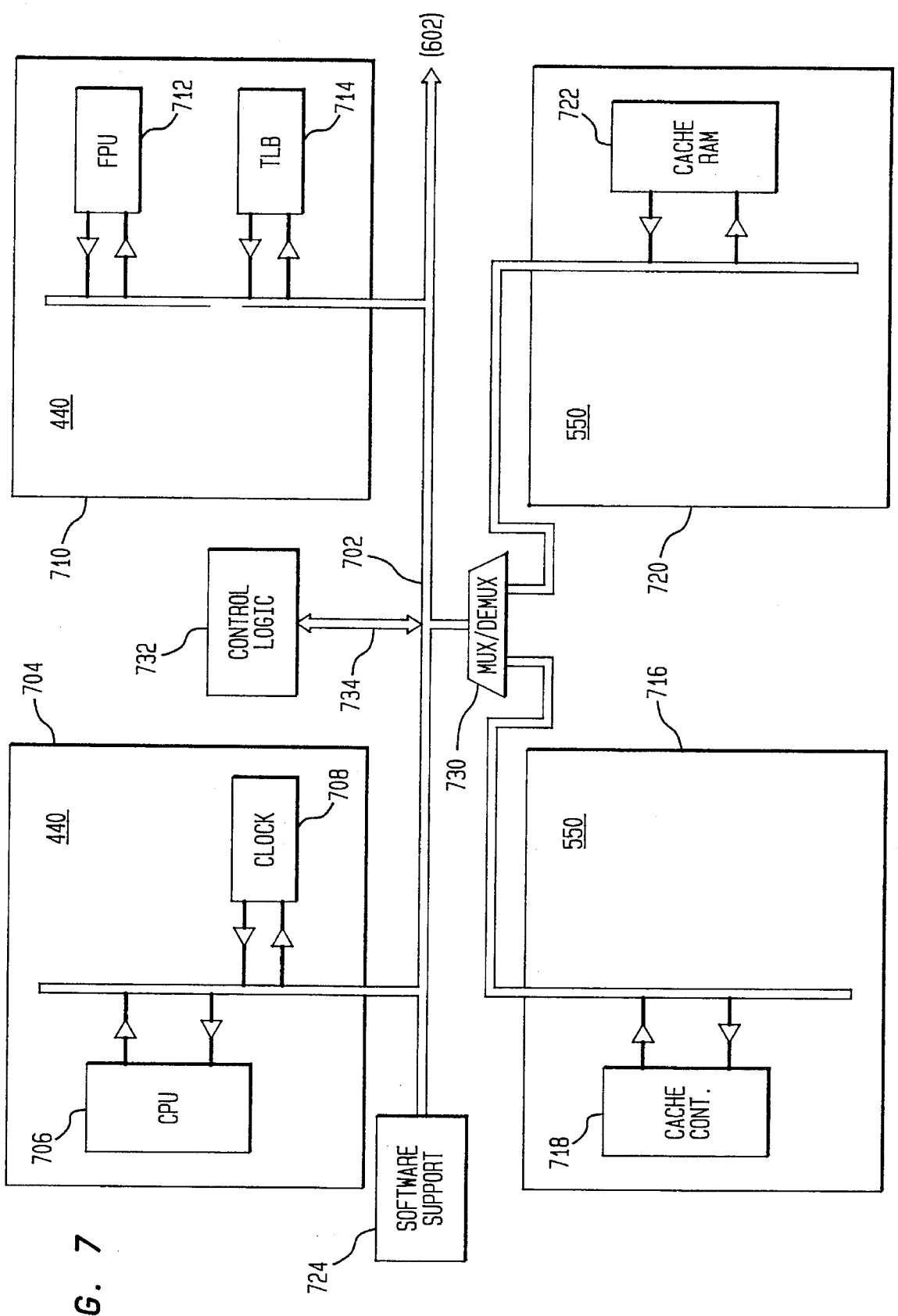
FIG. 7 is an illustrative embodiment of a hardware emulation accelerator assembled by the automated hardware accelerator system of FIG. 6.

An illustrative embodiment of a hardware emulation accelerator 700 assembled by automated hardware accelerator system 600 of FIG. 6 for a proposed microelectronic device design is shown in FIG. 7. The proposed microelectronic device to be emulated is an N-bit microprocessor with an on-chip cache system. Hardware emulation accelerator 700 must therefore comprise functional modules from both the chips discussed above with reference to FIGS. 4 and 5. For example, hardware emulation accelerator 700 may comprises two N-bit microprocessor chips 440, two cache memory unit chips 550 and an external I/O bus 702.

A first N-bit microprocessor chip labeled 704 includes a working CPU 706 and clock generator 708. The second N-bit microprocessor chip labeled 710 includes a working FPU 712 and TLB 714. A first cache memory unit chip 716 includes a working cache controller 718 and a second cache memory unit chip 720 includes a working cache RAM 722. An external bus is used to interconnect the chips. Because the paths between the functional modules are longer on hardware emulation accelerator 700 then they would be on the final manufactured chip, the emulation clock speed must be reduced. Thus, the system clock, in this example derived from clock generator 708, is operated at a reduced speed compared to desired clock speed of the proposed microelectronic device design. In a preferred embodiment of the present invention the clock generator should have a wide, non-overlapping duty cycle (clock rate) to combat clock skew problems.

Hardware emulation accelerator 700's I/O bus 702 is connected to workstation 602 for the application of test vectors. Workstation 602 also monitors hardware emulation accelerator 700 via I/O bus 702. A software support block 724 can be added to the system so that additional control or functionality can be added. Software block 724 thus provides a means of flexibly changing control of modules or blocks or added functionality to the hardware emulation accelerator.

By employing "selective power down" of the functional modules not used for the hardware emulator accelerator, further power saving and prolonging of chip life time can be achieved. Since static CMOS circuits use negligible power when not switching, selective power down can be implemented by not providing clock signals or input signals to the unused functional modules of the chips that comprise the hardware emulator accelerator. Further details of selective power down are discussed in commonly owned, co-pending application Ser. No. 07/860,717, titled: Selective Power Down for High Performance CPU/System (Attorney Docket No. SP045/1397.0230000), the disclosure of which is incorporated herein by reference.

In a further embodiment of the present invention, additional testability can be achieved by connecting an FPGA tester to bus 702. A tester such as the Quickturn product discussed above could be added to apply specific test vectors, or a modified tester similar to Quickturn using re-programmable EPROM or EEPROM devices could be employed along with the hardware emulation accelerator.

To avoid possible congestion problems on bus 702, one or more conventional multiplexer/demultiplexers (MUX/DEMUX) 730 could be used. MUX/DEMUXs 730 may be implemented locally by integrating them directly on chips 440 and 550, or globally as discrete devices connected between the chips and bus 702, the latter is shown in FIG. 7. As will become evident to those skilled in the art, control logic and random "glue logic" may be necessary to match logic protocols, adjust clock edges, or the like. Such control and glue logic is shown generally at reference number 732. For example, control logic 732 may generate select signals (not shown) for MUX/DEMUXs 730 to support time domain multiplexing of signals from various chips. Control logic 732 is shown as a discrete component of the hardware emulation accelerator, but it could be implemented by a functional module or block on a chip 440 or 550, for example. Control logic 732 is coupled to data/control bus 702 via a bi-directional bus 734.

Figure 8A:
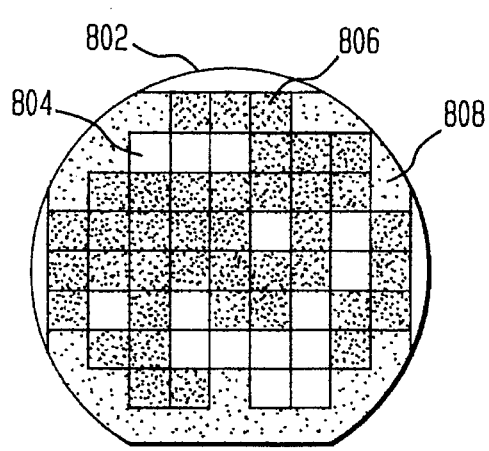
FIGS. 8A–F are wafer maps showing tested silicon chips and functional modules according to the present invention.
Figure 8B:
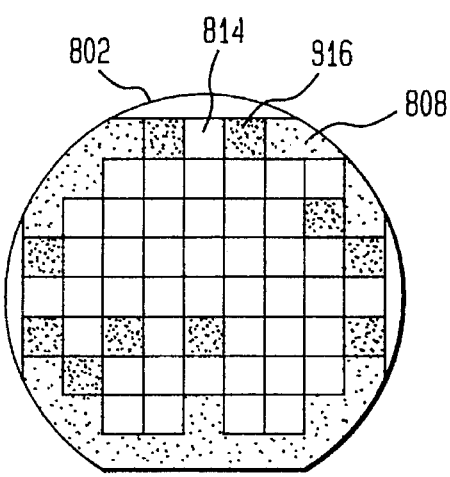
Figure 8C:
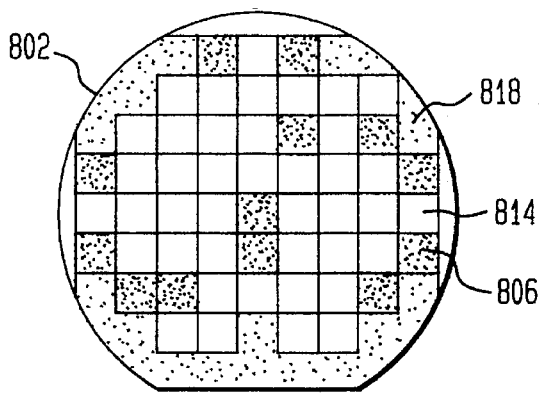
Figure 8D:
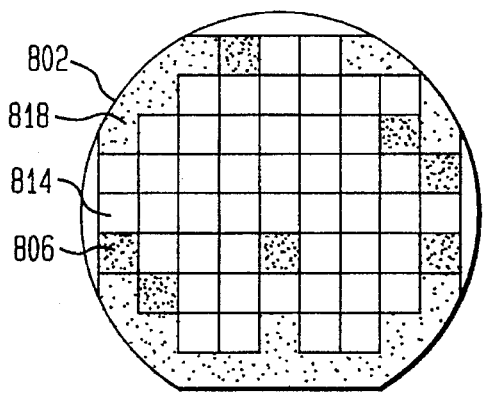
Figure 8E:
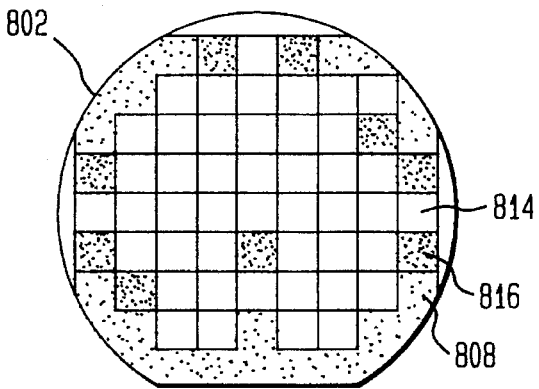
Figure 8F:
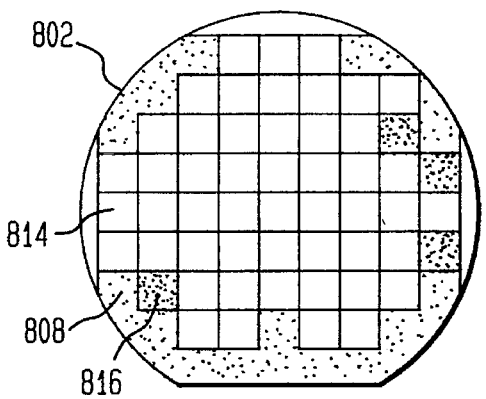

A set of wafer maps showing tested, real silicon chips and functional modules according to the present invention are shown in FIGS. 8A–F. Wafers 802 are subdivided into a plurality of squares which represent actual semiconductor microelectronic device chips which were manufactured to meet a particular proposed design. Wafers 802 in FIG. 8A represent a wafer which has been tested to verify the operation of each microelectronic device (i.e., each square). Wafer 802 in FIGS. 8B–F represent the same wafer shown in FIG. 8A, but five separate functional modules on each microelectronic device have been tested independently of the other functional modules, according to the enhanced testability of the layout methodology of the present invention.

The test results of an actual microelectronic device are shown in FIGS. 8A–F. FIG. 8A shows the global test results of the entire microelectronic device. FIGS. 8B–F show the test results of the following functional modules, respectively: a barrel shifter (BS), a 32-bit register file (RF), a four-input adder (QAD), a single precision arithmetic logic unit (ALS), and a scanner (SCN). In FIG. 8A, white squares 804 represent microelectronic devices that are fully operational, and in FIGS. 8B–F white squares 814 represent the total number of a particular functional module that are operational. Similarly, in FIG. 8A, black squares 806 represent microelectronic devices that are not fully operational, and in FIGS. 8B–F black squares 816 represent non-operational functional modules. Sections 808 represent sections of wafers 802 that were not tested.

Upon inspection of the test results in FIG. 8A, many microelectronic devices were not fully operational. More specifically, the yield of that particular wafer, as calculated conventionally, was 28%. The yield of the individual functional modules shown in FIGS. 8B–F according to the present invention were 81%, 76%, 87%, 83% and 93%, respectively. Thus, according to the present invention, the yield of the individual functional modules as compared to that of the overall microelectronic device is dramatically improved.

Figure 9:
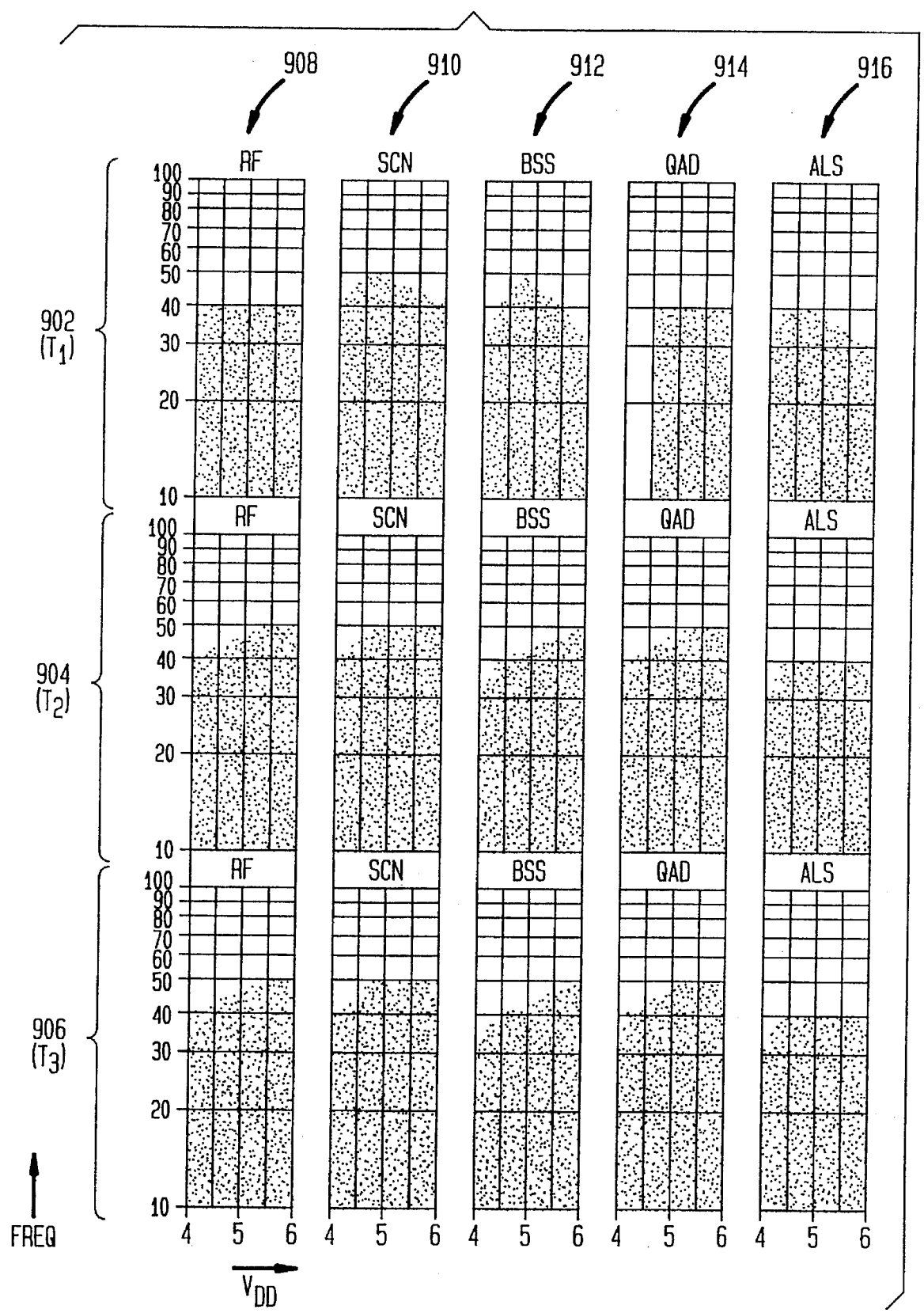
FIG. 9 shows "Frequency v. Voltage" plots of functional modules of real silicon chips manufactured according to the present invention.

Test results of an actual hardware accelerator including the five functional modules discussed in connection with FIGS. 8B–8F will now be discussed. FIG. 9 shows "Frequency v. Voltage" plots of the five functional modules according to the present invention. These plots show true electrical and temperature performance of a hardware emulation accelerator at different speeds.

Three plots for three different temperature tests $T_1$ (70° C.), $T_2$ (25° C.), and $T_3$ (0° C.) are shown at 902, 904 and 906, respectively. The plots for each functional module RF, SCN, BS, QAD and ALS are shown at 908, 910, 912, 914 and 916, respectively. Voltage $V_{DD}$ (5V±1V) at which the functional modules were tested is shown on the X-axis, and the frequency (10–100 MHz) at which the functional modules were tested is shown on the Y-axis.

The results shown in FIG. 9 were generated in a relatively short period of time. The total time from customer design to actual test results is reduced significantly using the present invention; such results cannot easily be emulated with conventional techniques, if at all.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

What is claimed is:

1. A method for emulating a microelectronic device using physically implemented functional modules, the emulation method being adapted for emulating the operation of a proposed design of said microelectronic device having at least two functional modules controlled by a system clock, said method comprising the steps of:

(1) testing a plurality of chips, each of said having a plurality of physical functional modules, to identify which of said physical functional modules are defective and which are non-defective, and saving in a megacell library any of said chips having both defective and non-defective physical functional modules;

(2) specifying two or more proposed functional modules which will make up said proposed design of said microelectronic device;

(3) selecting from said megacell library two or more of said chips, each having both defective and non-defective physical functional modules, each of said selected non-defective physical functional modules being an operational physical implementation of one of said proposed functional modules and comprising more than 1,000 transistors, each of said selected non-defective physical functional modules being physically and functionally identical to one of said two or more proposed functional modules of said proposed design of said microelectronic device;

(4) physically interconnecting said selected non-defective physical functional modules from said chips selected from step 3 such that said selected non-defective physical functional modules communicate directly with each other;

(5) selecting and applying a clock rate to said interconnected physical functional modules; and (6) applying one or more test vectors to said proposed design using said interconnected physical functional modules, wherein the results of each test vector better simulate in actual function and at operational speed said proposed design as compared to a comparable software- or field-programmable gate array-based simulation of said proposed design.

2. A method according to claim 1, wherein step 4 further comprises the steps of:

(i) providing input/output bus means for permitting signals to be transferred to/from said interconnected physical functional modules, and (ii) providing buffer means to selectively couple together said interconnected physical functional modules and said input/output bus means so as to produce said proposed design of said microelectronic devices.

3. A method according to claim 1, wherein step 5 further comprises the step of selecting said clock rate to have a non-overlapping duty cycle and to be slower than a preselected clock rate for the proposed design.

4. A method according to claim 2, wherein said selecting step further comprises the step of selecting functional modules having different process corners to cover a worst case condition emulation.

5. A method according to claim 2, wherein step ii further comprises the step of providing tri-state buffering to selectively couple together said interconnected physical functional modules and said input/output bus means so as to produce said proposed design of said microelectronic devices.

6. A method according to claim 5, wherein step ii further comprises the step of providing bi-directional tri-state buffering of data to be transferred between said physically-based implemented functional modules and said input/output bus means.

7. A simulation system for a microelectronic device having two or more functional modules from a megacell library, the simulation system utilizing actual physically implemented versions of each functional module from the megacell library so as to provide a more accurate and much faster simulation than a comparable software- or field-programmable gate array-based simulation, the simulation system comprising:

(1) means for testing a plurality of chips, each of said chips having a plurality of physical functional modules, to identify which of said physical functional modules are defective and which are non-defective, and for saving in said megacell library any of said chips having both defective and non-defective physical functional modules;

(2) two or more chips from said megacell library, each chip having both defective and non-defective physically-based implemented functional modules, at least one of said non-defective physically-based implemented functional modules representing a functional module of a proposed design of a proposed microelectronic device and comprising more than 1,000 transistors, wherein said at least one of said non-defective physically-based implemented functional modules is physically and functionally identical to said functional module of said proposed design of said proposed microelectronic device;

(3) interconnecting means for electrically coupling together said chips such that said chips communicate directly with each other so as to produce said proposed design of said proposed microelectronic device; and (4) test vector means for running one or more test vectors at a preselected clock speed of said proposed design using said interconnected chips to produce said proposed design, wherein said test vectors can be completed much faster as compared to a comparable software- or field-programmable gate array-based simulation and wherein the results of said test vectors are much more accurate than the comparable simulations.

8. A system according to claim 7, wherein said interconnecting means further comprises:

(i) input/output bus means for permitting signals to be transferred to/from said physically-based implemented functional modules; and (ii) buffer means to selectively couple together said physically-based implemented functional modules and said input/output bus means so as to produce said proposed design of said proposed microelectronic devices.

9. A system according to claim 8, wherein said buffer means comprise tri-state buffer means.

10. A system according to claim 9, wherein said tri-state buffer means comprise bi-directional tri-state buffer devices permitting data to be transferred between said physically-based implemented functional modules and said input/output bus means.

11. A system according to claim 10, wherein said tri-state buffer devices include at least one control input to receive select signals to perform said transfer of data between said physically-based implemented functional modules and said input/output bus means.

12. A system for emulating a microelectronic device using physically implemented functional modules, the emulation method being adapted for emulating the operation of a proposed design of said microelectronic device having at least two functional modules controlled by a system clock, comprising:

(1) means for designing a first microelectronic device having one or more functional modules wherein said functional modules are capable of being individually tested and electrically isolated;

(2) means for testing the functionality of said first microelectronic device, wherein if one or more of said functional modules are non-defective and one or more of said functional modules are defective then saving said first microelectronic device;

(3) means for specifying proposed functional modules which will make up said proposed design of a second microelectronic device;

(4) means for selecting one or more non-defective functional modules from said first microelectronic device specified in said proposed design of said second microelectronic device, said functional modules each comprising more than 1,000 transistors, wherein each of said selected non-defective functional modules is physically and functionally identical to one of said proposed functional modules of the proposed design of said second microelectronic device;

(5) means for physically interconnecting said one or more selected non-defective functional modules of said first microelectronic device with functional modules on a third microelectronic device such that said physical functional modules communicate directly with each other;

(6) means for selecting and applying a clock rate to said interconnected functional modules; and (7) means for applying one or more test vectors to said proposed design using said physically interconnected functional modules, wherein the results of each test vector better simulate in actual function and at operational speed said proposed design as compared to a comparable software or field-programmable gate array-based simulation of said proposed design.

13. The system of claim 12, wherein said third microelectronic device has non-defective and defective functional modules.

14. The system of claim 12, wherein said means for physically interconnecting further comprises:

(i) means for providing input/output bus means for permitting signals to be transferred to/from said selected physically interconnected functional modules, and (ii) means for providing buffer means to selectively couple together said selected physically interconnected functional modules and said input/output bus means so as to produce said proposed design of said microelectronic devices.

15. The system of claim 12, wherein said means for selecting and applying a clock rate further comprises means for selecting said clock rate to have a non-overlapping duty cycle and to be slower than a preselected clock rate for the proposed design.

16. The system of claim 14, wherein said means for selecting one or more non-defective functional modules further comprises means for selecting functional modules having different process corners to cover a worst case condition emulation.

17. The system of claim 14, wherein said means for providing buffer means further comprises means for providing tri-state buffering to selectively couple together said selected physically interconnected functional modules and said input/output bus means so as to produce said proposed design of said microelectronic devices.

18. The system of claim 17, wherein said means for providing buffer means further comprises means for providing bidirectional tri-state buffering of data to be transferred between said physically interconnected functional modules and said input/output bus means.

* * * * *